(12) United States Patent
Ichihara et al.

(10) Patent No.: US 8,236,591 B2
(45) Date of Patent: Aug. 7, 2012

(54) SEMICONDUCTOR LIGHT EMITTING ELEMENT AND METHOD FOR MANUFACTURING THE SAME

(75) Inventors: Takashi Ichihara, Tokushima (JP); Hirofumi Yoshida, Tokushima (JP); Takao Yamada, Komatsushima (JP); Yohei Wakai, Anan (JP)

(73) Assignee: Nichia Corporation, Anan-shi (JP)

( * ) Notice: Subject to any disclaimer, the term of this patent is extended or adjusted under 35 U.S.C. 154(b) by 259 days.

(21) Appl. No.: 12/670,631

(22) PCT Filed: Jul. 31, 2008

(86) PCT No.: PCT/JP2008/063735
§ 371 (c)(1),
(2), (4) Date: Jan. 25, 2010

(87) PCT Pub. No.: WO2009/020033
PCT Pub. Date: Feb. 12, 2009

(65) Prior Publication Data
US 2010/0187542 A1    Jul. 29, 2010

(30) Foreign Application Priority Data

Aug. 3, 2007 (JP) ................................. 2007-203353
Aug. 3, 2007 (JP) ................................. 2007-203359

(51) Int. Cl.
*H01L 29/06* (2006.01)
*H01L 29/08* (2006.01)
(52) U.S. Cl. ... 438/33; 438/462; 257/620; 257/E21.599; 219/121.6; 219/121.66; 219/121.69
(58) Field of Classification Search ............... 219/121.6, 219/121.66, 121.69; 438/33, 462; 257/E21.599, 257/620
See application file for complete search history.

(56) References Cited

U.S. PATENT DOCUMENTS

| 8,062,960 B2 * | 11/2011 | Kato ............................ 438/462 |
| 2005/0179130 A1 * | 8/2005 | Tanaka et al. ................. 257/730 |
| 2005/0202596 A1 | 9/2005 | Fukuyo et al. |
| 2005/0224783 A1 | 10/2005 | Matsuyama et al. |
| 2006/0011593 A1 | 1/2006 | Fukuyo et al. |
| 2006/0148212 A1 | 7/2006 | Fukuyo et al. |
| 2007/0158314 A1 | 7/2007 | Fukumitsu et al. |
| 2007/0205490 A1 * | 9/2007 | Kusunoki ..................... 257/620 |

FOREIGN PATENT DOCUMENTS

| JP | 2003-318441 A | 11/2003 |
| JP | 2003-338468 A | 11/2003 |
| JP | 2005-101566 A | 4/2005 |
| JP | 2005-109432 A | 4/2005 |
| JP | 2005-191551 A | 7/2005 |
| JP | 2006-066869 A | 3/2006 |
| JP | 2006-245043 A | 9/2006 |

* cited by examiner

*Primary Examiner* — Jarrett Stark
(74) *Attorney, Agent, or Firm* — Global IP Counselors, LLP

(57) ABSTRACT

A method for manufacturing a semiconductor light emitting element from a wafer in which a gallium nitride compound semiconductor has been laminated on a sapphire substrate having an orientation flat, comprises of: laminating a semiconductor layer on a first main face of the sapphire substrate having an off angle θ in a direction Xo parallel to the orientation flat; forming a first break groove that extends in a direction Y substantially perpendicular to the direction Xo, on the semiconductor layer side; forming a second break line that is shifted by a predetermined distance in the ±Xo direction from a predicted split line within the first break groove and parallel to the first break groove in the interior of the sapphire substrate and corresponding to the inclination of the off angle θ; and splitting the wafer along the first and/or second break line.

28 Claims, 6 Drawing Sheets

(a)

(b)

(c)

(a)

(b)

SEMICONDUCTOR LIGHT EMITTING ELEMENT AND METHOD FOR MANUFACTURING THE SAME

CROSS-REFERENCE TO RELATED APPLICATION

This national phase application claims priority to Japanese Patent Application Nos. 2007-203353 and 2007-203359 both filed on Aug. 3, 2007. The entire disclosures of Japanese Patent Application Nos. 2007-203353 and 2007-203359 are hereby incorporated herein by reference.

TECHNICAL FIELD

The present invention relates to a semiconductor light emitting element and a method for manufacturing this element, and more particularly relates to a semiconductor light emitting element with which the interior of a wafer is irradiated with light that passes through the wafer, and the wafer is made into chips, and to a method for manufacturing this element.

BACKGROUND ART

In the past, a wafer with a laminated semiconductor layer was made into chips with a dicer, scriber, laser scriber, or the like.

However, a problem with a nitride semiconductor layer is that it is usually laminated on a wafer composed of a sapphire substrate, and a sapphire substrate does not tend to cleave parallel to an orientation flat (mainly the A face or C face), making it difficult to split the layer with a scriber or the like.

Also, when a nitride semiconductor layer is split with a dicer, a problem is that cracking, chipping, and the like are apt to occur when a mark is made with a grindstone.

Furthermore, when a groove is formed with a laser scriber and this groove is used for breaking, a split that is at an angle to the film thickness direction, that is, one that is inclined, may be made in the non-cleavable sapphire substrate, so that there is a split part of the way through the semiconductor layer that functions as an element, and this results in a defective product.

A method has been proposed to avoid such splitting, in which a first split groove is formed from the gallium nitride compound semiconductor layer side, a second split groove is formed from the sapphire substrate side at a location that does not overlap the center line of the first split groove, and chips are produced by effectively utilizing a split in an inclination direction (for example, Japanese Laid-Open Patent Application 2005-191551).

Another proposed method involves making chips by forming a first split groove in the surface of the semiconductor layer, and forming a second split groove by irradiating the interior of a sapphire substrate with a laser from the first split groove side (for example, Japanese Laid-Open Patent Application 2003-338468).

Yet another proposed method involves making chips by using a laser to internally work a sapphire substrate from the rear, and then scribing the rear of the sapphire substrate, or working the front by laser irradiation (for example, Japanese Laid-Open Patent Application 2005-109432).

Another proposed method involves establishing a predicted separation face in a predetermined inclination direction when directing a laser into the interior of a sapphire substrate, and directing the laser intermittently and in multiple stages from the rear face of the sapphire substrate so as to follow along this predicted separation face, and forcibly divide into chips in an inclination direction (for example, Japanese Laid-Open Patent Application 20006-245043).

DISCLOSURE OF THE INVENTION

However, even when the positions of the first split groove and second split groove are adjusted so as to effectively utilize splitting in the inclination direction, depending on the thickness of the sapphire substrate, the intended split in the inclination direction will not necessarily be achieved, and the above problems may remain. Furthermore, every substrate on which a semiconductor element is to be produced has to be test-split in the splitting direction for that substrate ahead of time, and this makes the manufacturing process more complicated.

Also, merely forming a split groove in the sapphire substrate interior by irradiating the substrate interior with a laser may not result in the intended vertical cleavage of the sapphire substrate, and the problem of splitting in an inclination direction still appears.

Furthermore, with a method in which a wafer is divided in an inclination direction by laser irradiation along a preset predicted separation face, the multi-stage intermittent laser irradiation over substantially the entire thickness direction of the sapphire substrate requires control of a plurality of lasers in the same planar direction as the film thickness direction, and this takes more time and makes the manufacturing process more complicated. In addition, portions modified by laser irradiation over the entire thickness direction of the sapphire substrate tend to cause light emitted from the semiconductor element to be absorbed, which is a problem in that it leads to a reduction in the light emission efficiency of the semiconductor element.

This invention was conceived in an effort to solve the above problems, and it is an object thereof to provide a method for manufacturing a semiconductor light emitting element with which, in making chips from a wafer in which a gallium nitride compound semiconductor is laminated on a sapphire substrate, chips can be made accurately and at extremely high yield, with high chip strength ensured, regardless of the thickness of the sapphire substrate.

The inventors of the present invention ascertain that there is a correlation between the inclination direction of the sapphire substrate in making chips from a wafer and the off angle of the sapphire substrate, and unexpectedly found that it is possible to control the split face which makes chips from a wafer according to the direction of the off angle, thereby completing the present invention.

Also, the inventors ascertain that that there is a regularity between the inclination direction of the split face of the sapphire substrate in making chips from a wafer and the disposition or shape of the protruding portions in the course of seeking the method for enhancing the emission efficiency of the semiconductor light emitting element by forming a plurality of protruding portions on the surface of the sapphire substrate before laminating the semiconductor layer and utilizing the light scattering and refracting effect of the protruding portions, while the inventors earnestly study the cleavability of the sapphire substrate laminated the semiconductor layers thereon, and unexpectedly found that it is possible to control the split face which makes chips from a wafer according to the shape of the protruding portions, thereby completing the present invention.

The present invention is a method for manufacturing a semiconductor light emitting element from a wafer in which a gallium nitride compound semiconductor has been laminated on a sapphire substrate having an orientation flat, said method comprising of: laminating a semiconductor layer on a first main face of the sapphire substrate having an off angle θ in a direction Xo parallel to the orientation flat; forming a first break groove that extends in a direction Y substantially perpendicular to the direction Xo, on the semiconductor layer side; forming a second break line that is shifted by a predetermined distance in the ±Xo direction from a predicted split line within the first break groove and parallel to the first break groove in the interior of the sapphire substrate and corresponding to an inclination of the off angle θ; and splitting the wafer along the first break groove and/or second break line.

Also, the present invention is a method for manufacturing a semiconductor light emitting element from a wafer in which a gallium nitride compound semiconductor has been laminated on a sapphire substrate, said method comprising of: forming a protruding portion whose bottom face shape is polyhedral by etching on a first main face of the sapphire substrate; laminating a semiconductor layer on the first main face of the sapphire substrate; forming on the semiconductor layer side a first break groove that extends in a direction Y that is substantially perpendicular to a direction X that faces a single acute vertex from the center of gravity of the polyhedral shape of the protruding portion bottom faces in a plan view of the first main face side of the sapphire substrate; forming a second break line that is shifted by a predetermined distance in a −X direction from a predicted split line within the first break groove and parallel to the first break groove in the interior of the sapphire substrate; and splitting the wafer along the first break groove and/or second break line.

Further, the present invention is a semiconductor light emitting element, which is a substantially square shape, comprising: a sapphire substrate; and a gallium nitride compound semiconductor layer laminated on a first main face of said substrate, one pair of opposite side faces of the semiconductor light emitting element are substantially perpendicular to the first main face of the sapphire substrate, and another pair of side faces have a face that is inclined with respect to the first main face on the first main face side of the sapphire substrate, and a face that is substantially perpendicular to the second main face on the second main face side of the sapphire substrate.

Furthermore, the present invention is a semiconductor light emitting element, which is a substantially square shape, comprising: a sapphire substrate; and a gallium nitride compound semiconductor layer laminated on a first main face of said substrate, a protruding portion with a polygonal bottom face shape is formed on the first main face of the sapphire substrate, in a plan view from the first main face side of the sapphire substrate, the pair of opposing side faces of the semiconductor light emitting element that extend in a direction Y that is substantially perpendicular to a direction X that faces a single acute vertex from the center of gravity of the polyhedral shape of the protruding portion bottom face have a face that is inclined to the first main face on the first main face side of the sapphire substrate, and a face that is substantially perpendicular to the second main face on the second main face side of the sapphire substrate, and another pair of side faces is substantially perpendicular to the first main face of the sapphire substrate.

With the method for manufacturing a semiconductor light emitting element of the present invention, the laser irradiation position from the sapphire substrate rear surface can be set properly according to the off angle of surface of the sapphire substrate, or according to the shape of the protruding portions provided to the surface of the sapphire substrate. Consequently, the sapphire substrate can be split at the intended split face, which affords a markedly higher yield. As a result, there is no need to check the split face ahead of time by test-splitting, no multi-stage laser irradiation that is shifted in the in-plane direction has to be performed in the entire thickness direction of the sapphire substrate, and the manufacturing cost can be reduced.

Also, in making chips, regardless of the thickness of the sapphire substrate, the split face can be controlled even with rather thick substrates, chip strength can be ensured, and handling is easier in prior and subsequent steps. Furthermore, effective control of the split face makes it unnecessary to provide a margin that foresees unintended splitting and the like, which maximizes the number of chips that can be obtained form a single wafer, and this also boosts the production efficiency.

DETAILED DESCRIPTION OF THE EMBODIMENTS

With the method for manufacturing the semiconductor light emitting element of the present invention, first a sapphire substrate is provided.

The sapphire substrate usually is a substantially disk-shaped and has an orientation flat (OF), as a wafer. The sapphire substrate can be, for example, a substrate composed of hexagonal $Al_2O_3$, a substrate made of sapphire whose main plane is the C plane, A plane, R plane, or M plane, or a substrate in which the r axis is perpendicular to the a axis. The orientation flat is preferably the A plane or C plane. It is especially preferable to use a sapphire substrate in which the C plane (0001) is the main plane, and the orientation flat is the A plane (11-20).

There are no particular restrictions on the thickness of the sapphire substrate, but in view of strength in the lamination of the semiconductor layer, the formation of the protruding portions (discussed below) and so on, about 200 μm to 2 mm is preferable.

As will be discussed below, the sapphire substrate does not necessarily have to have an off angle when protruding portions are formed on the first main face, preferably has an off angle of about 0 to ±10° on the first main face and/or second main face, for example, with off angles of about 0 to ±5°, about 0 to ±2°, about 0 to ±0.5°, about 0 to ±0.25°, and about 0 to ±0.15° being even better. The off angle may be formed in steps.

Consequently, the semiconductor layer formed over this can be grown with good crystallinity.

Also, an off angle of the first main face and/or second main face of the sapphire substrate can be used effectively to form a first break groove and second break line (discussed below) at the optimal locations.

The off angle referred to here is an inclination angle with respect to a specific reference crystal plane that constitutes the first main face and/or second main face of the sapphire substrate, and preferably the first main face, and is, for example, an angle of inclination with respect to the C plan (0001), etc. There are no particular restrictions on the off angle direction, which may be parallel, perpendicular, or inclined to the orientation flat, but preferably there is at least a direction that is parallel to the orientation flat.

Figure 7:
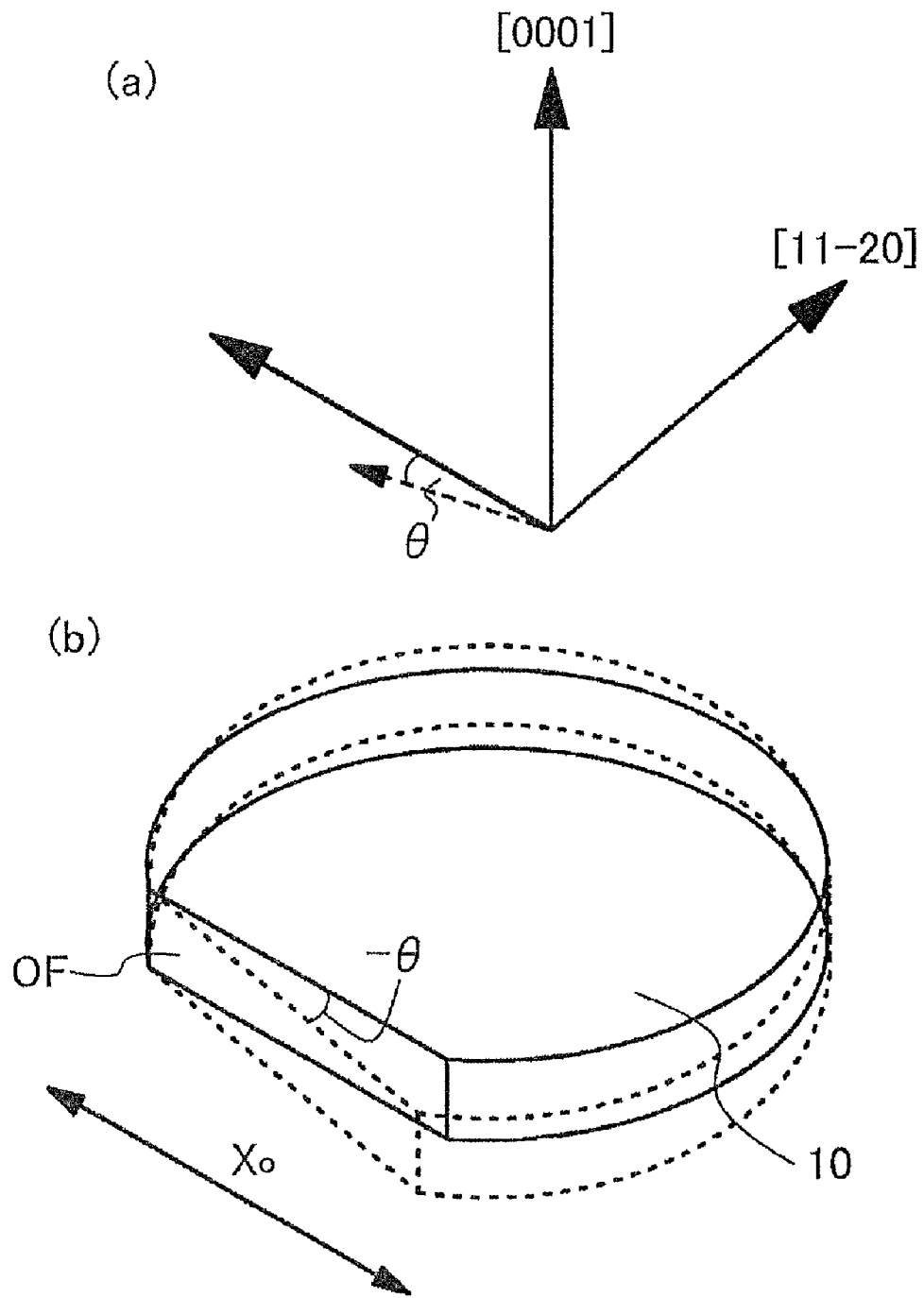
FIG. 7 is a view explaining the off angle of the sapphire substrate used in the method for manufacturing the semiconductor light emitting element of the present invention.

As shown in FIGS. 7(a) and 7(b), an orientation flat (OF: such as the A plane (11-20)) that indicates a specific crystal orientation is formed for indicating the crystal orientation of the sapphire substrate 10.

The off angle refers to an inclination angle θ of an Xo direction (see arrow Xo in FIG. 7(b)) that is parallel to the orientation flat.

In this Specification, unless otherwise specified, in a plan view from the first main face side of a sapphire substrate in which the orientation flat is disposed at the front (near), the direction facing to the right side is termed Xo (+Xo), and the direction facing to the left side is termed −Xo. Also, as shown in FIG. 7(b), with this orientation flat disposed in the front (indicated by the solid line), when the right side as seen in these drawings does down (indicated by the dotted line), that is, when it goes down in the Xo direction, this is defined as −θ. As shown in FIG. 7(a), when the right side rises, that is, when the rise is in the Xo direction, this is expressed as θ or +θ (see FIGS. 5(a) and 5(b)).

In particular, when the off angle is formed at about ±0.25° or less, and especially about 0.15° or less, in a direction parallel to the orientation flat, there is a close correlation between the off angle and the inclination of the substrate split, or there tends to be a close correlation between the off angle and the inclination of the substrate split produced by the shape of the protruding portions (discussed below), and the inclination of the substrate split can be controlled.

It has been confirmed that the relationship of the inclination direction of the substrate split with respect to the off angle has quite a high precision. That is, it was discovered that if, as discussed above, a wafer in which the C plane is the main plane and the A plane is the orientation flat is used, the inclination of the sapphire substrate split (such as the directionality of the r axis) can be determined by the angle and direction of the off angle θ in a specific direction, and a split made accordingly, although this may be affected by the interrelation of various factors such as whether or not there is an off angle θ other than in a direction substantially parallel to the orientation flat, the extent of the off angle θ, and the surface roughness of the sapphire substrate. Consequently, by utilizing an extremely simple method involving the measurement of the off angle of the sapphire substrate surface, it is possible to control the splitting of the sapphire substrate, and the yield can be increased markedly.

The sapphire substrate may not only have an off angle on its surface, but protruding portions may be formed on the first main face and/or the second main face. There are no particular restrictions on the size, shape, and the like of the protruding portions here, but an example is described in Japanese Laid-Open Patent Application 2003-318441. This makes it possible to improve the emission efficiency of the semiconductor light emitting element by utilizing the light scattering and refracting effect of the protruding portions.

Also, particularly when these protruding portions are formed on the second main face, they may be partially or completely removed by dry or wet etching, polishing, or the like at some point in the manufacturing process.

It is particularly favorable to form the protruding portions on the first main face of the sapphire substrate.

There are no particular restrictions on the size and shape of the protruding portions that are formed, but it is suitable, for example, if the planar shape of the protruding portions as viewed from the first main face side of the sapphire substrate (that shape of the portion closest to the first main face; that is, the bottom face shape) is polygonal. A triangular or hexagonal shape is especially included. Examples of the hexagonal shape here include ones with a modified shape in which acute and obtuse angles are disposed alternately. In this Specification, the expression of the polygonal or other such shape refers not only to a shape that is completely polygonal or the like in geometric terms, but also encompasses similar shapes and somewhat modified shapes, such as those in which the corners are rounded for the purposes of machining and the like.

The size of the planar shape of a protruding portion (bottom face shape), that is, the length of one of the sides that make up a protruding portion, is suitably at least $\lambda/4$ ($\lambda$ is the wavelength of the emitted light). More specifically, an example is a range of about 0.1 to 5 μm. The spacing between the protruding portions is suitably at least $\lambda/4$. An example is about 100 μm or less, and particularly about 20 μm or less. This spacing refers to the shortest distance between adjacent protruding portions on the substrate surface (protruding portion bottom face).

The vertical cross sectional shape of the protruding portions may be triangular, square, trapezoidal, semicircular, or any other shape, but a triangular, trapezoidal, semicircular, or other such shape is preferable because there will be faces that are inclined or curved with respect to the main face of the substrate, so the light scattering and refracting effect can be enhanced. In particular, a trapezoidal shape is more preferable. In other words, the shape of the upper part of a protruding portion may be a conical shape, or may be a shape having an upper face that is circular (such as in FIGS. 1A and 1B), triangular (such as in FIGS. 2A and 2B), or the like. Regardless of the shape of the upper part of the protruding portions, the shift direction of a second break line (discussed below) can be determined by the bottom face shape of the protruding portions. Taper angle refers to the angle formed by the bottom and side faces of a protruding portion, examples of which include 90° or less, 75° or less, and 65° or less, and 20° or more, 30° or more, and 40° or more. The purpose of this is to ensure an increase in the efficiency of scattering or refraction, and to prevent pitting of the semiconductor layer.

The height of the protruding portions is suitably at least 5 nm, for example, and is suitably no more than the total thickness of the semiconductor layer laminated on the substrate. Also, if the wavelength of the emitted light set to be λ, the height is preferably at least λ/4. This is because the light can be sufficiently scattered or refracted, and a good flow of current in the lateral direction of the laminated semiconductor layer can be maintained, ensuring good emission efficiency.

There are no particular restrictions on the method for forming the protruding portions on the first main face of the sapphire substrate, which can be formed by any method that is known in this field. For example, etching (either wet or dry) such as that described below can be performed using a mask pattern of a suitable shape. Wet etching is particularly preferable. In this case, an etchant includes, for example, a mixed acid of sulfuric acid and phosphoric acid, KOH, NaOH, phosphoric acid, potassium pyrophosphate, and the like.

Protruding portions with a polygonal bottom face shape can be obtained, for example, by suitably adjusting the shape of the mask pattern being used, the etching method, and the conditions. As to the material and shape of the mask pattern here, for example, it can be formed by an insulating film (a resist, $SiO_2$, etc.), and it includes a repeating pattern with a polygonal shape, such as a shape that is square or triangular, or a circular or elliptical shape. The shape of this mask pattern is achieved by a known method such as photolithography and etching technique.

The etching performed to form the mask pattern can be accomplished by a method that is known in this field, such as dry or wet etching. For example, the method includes dry etching such as reactive ion etching, reactive ion beam etching, ion milling, focused beam etching, ECR etching, and the like. An etchant for wet etching includes one which is the same as the above.

The inventors discovered that the shape of the protruding portions is regular with respect to the inclination of the sapphire substrate split, and that there is a tendency toward regularity between the off angle of the surface of the sapphire substrate and the inclination of the sapphire substrate split.

In other words, as discussed above, if a wafer in which the C plane is the main face and the A plane is the orientation flat is used, then protruding portions with a polygonal bottom face shape, such as triangular or hexagonal, in plan view as seen from the first main face side of the sapphire substrate can be formed depending on the shape of the mask pattern and the etching conditions (the type of etchant, the etching time, etc.). It was discovered that there is a tendency for the orientation of one acute angle of the protruding portion bottom face to coincide with a direction parallel to the orientation flat (this direction can be the Xo direction, for example), and that there is a tendency for one acute angle of a protruding portion to face in the ±X direction, corresponding to ± of the off angle θ of the sapphire substrate.

In this Specification, unless otherwise specified, the direction X (+X) refers to the direction that faces a single acute vertex (see 11b in FIGS. 1A and 2A) from the center of gravity of the protruding portion, and the opposite direction is called the −X direction.

Consequently, when the surface of the sapphire substrate has an off angle, the positions of the first break groove and second break line discussed below can be determined from whether the off angle is positive or negative, and the yield can be increased at a high probability.

Also, if the surface of the sapphire substrate does not have an off angle, that is, if the off angle is 0°, forming the protruding portions by wet etching allows the positions of the first break groove and second break line to be determined, and the splitting of the sapphire substrate to be controlled, more accurately than when the off angle is determined from the bottom face shape of the protruding portions. Thus, it is possible to increase the yield at an even higher probability.

In particular, it was confirmed that the sapphire substrate could be controlled at higher accuracy by using the inclination of the substrate split produced by the shape of the protruding portions, than the relation of the direction of inclination of the substrate split to the off angle discussed above.

Next, the semiconductor layers are laminated on the first main face of the sapphire substrate. The semiconductor layers may be formed of a gallium nitride-based semiconductor compound, for example, $In_xAl_yGa_{1-x-y}N$ ($0 \leq x \leq 1$, $0 \leq y \leq 1$, $0 \leq x+y \leq 1$) can be included. In addition to this, it may be used the semiconductor layer which is partly substituted with B as a group III element. Also, it can be substituted a part of N as a group V element with P or As.

The semiconductor layers are usually formed of a first conductivity type semiconductor layer, a light emitting layer and a second conductivity type semiconductor layer in this order from the sapphire substrate side, and may contain one or more elements belonged to IV group such as Si, Ge, Sn, O, Ti, Zr, Cd, etc. which are n type impurities and element belonged to VI group such as Mg, Zn, Be, Mn, Ca, Sr etc. which are p type impurities. The amount of impurity is preferably $5 \times 10^{16}$/$cm^3$ or more, and $5 \times 10^{21}$/$cm^3$ or less.

There are no particular restriction on a growth method of the nitride semiconductor layer, it can be formed by means of any known method which can grow these nitride semiconductor layers, such as MOVPE (Metal-Organic Vapor Phase Epitaxy), MOCVD (Metal-Organic chemical vapor deposition), HVPE (Hydride Vapor Phase Epitaxy), MBE (Molecular Beam Epitaxy), or the like. In particular, MOCVD is preferable because it allows the nitride semiconductor to be growth with good crystallinity.

It is usually preferable for the semiconductor layer to be formed on the first main face of the sapphire substrate on which the protruding portions are formed, but it is also possible to form protruding portions by wet etching on the first main face of the sapphire substrate, determine the optimal positions of the first break groove and the second break line by means of the bottom face shape of these protruding portions, and then partially or completely remove the protruding portion by dry or wet etching, polishing, or the like to flatten the first main face, and then laminate the semiconductor layer over this. This makes it possible to manufacture semiconductor light emitting elements at a high yield, regardless of whether or not there are protruding portions on the final semiconductor light emitting element.

Also, the protruding portions may be formed on only the second main face of the sapphire substrate, or on both the first and second main faces, and as discussed above, after these protruding portions have been formed, they may be partially or completely removed once the optimal positions of the first break groove and the second break line have been determined. Thus forming protruding portions on the second main face allows the light take-off efficiency to be increased, and removing the protruding portions makes it possible for the sapphire substrate to be ultimately thinner.

Furthermore, as discussed above, the protruding portions may be formed on the first main face of the sapphire substrate, and an off angle on the second main face, or an off angle may be formed on the first main face, and the protruding portions on the second main face. Alternatively, only the off angle may be formed on the first main face.

Next, the first break groove is formed on the semiconductor layer side. The first break groove can be formed by a variety of methods, such as etching, dicing, pulse laser, and scribing.

There are no particular restrictions on the width, for example, it can be about 10 to 50 μm, for example. It is suitable to set the depth to the extent so as to expose the first conductivity type layer when the semiconductor layer is laminated a first conductivity type layer, a light emitting layer and a second conductivity type layer in this order.

Also, regardless of the constitution of the semiconductor layers, it is preferable to set the depth to the extent so as to expose the sapphire substrate.

The first break groove is formed so as to extend in at least a direction Y that is substantially perpendicular to the Xo direction that is parallel to the orientation flat of the sapphire substrate.

Figure 1A:
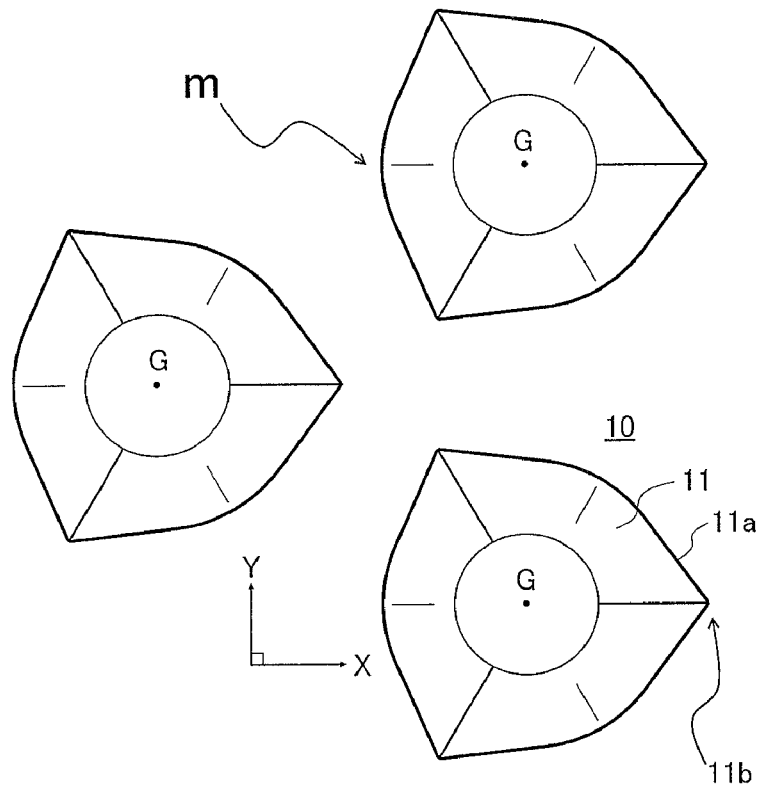
FIG. 1A is a plane view of the protruding portion formed in the one process of the method for manufacturing the semiconductor light emitting element of the present invention.
Figure 2A:
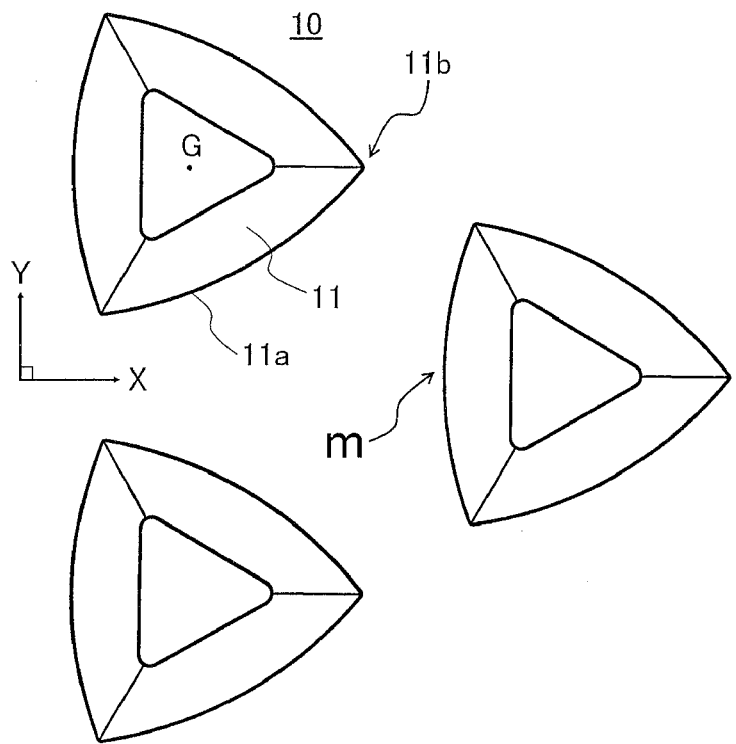
FIG. 2A is a plane view of still another protruding portion formed in the one process of the method for manufacturing the semiconductor light emitting element of the present invention.

Alternatively, the first break groove is formed so as to extend in at least a direction Y that is substantially perpendicular to the X direction that faces one acute angle vertex 11*b* from the center of gravity G of the triangular bottom face 11*a* of a protruding portion 11 on the sapphire substrate 10 formed in the previous step, in a plan view from the first main face side of the sapphire substrate, as shown in FIGS. 1A and 2A. The pitch in this case can be suitably adjusted according to the size of the semiconductor light emitting element to be obtained. An example is about 80 to 2000 μm.

The first break groove is preferably formed so as to extend in the direction X. This is because it is easier to make the semiconductor light emitting element into rectangular chips.

Figure 1B:
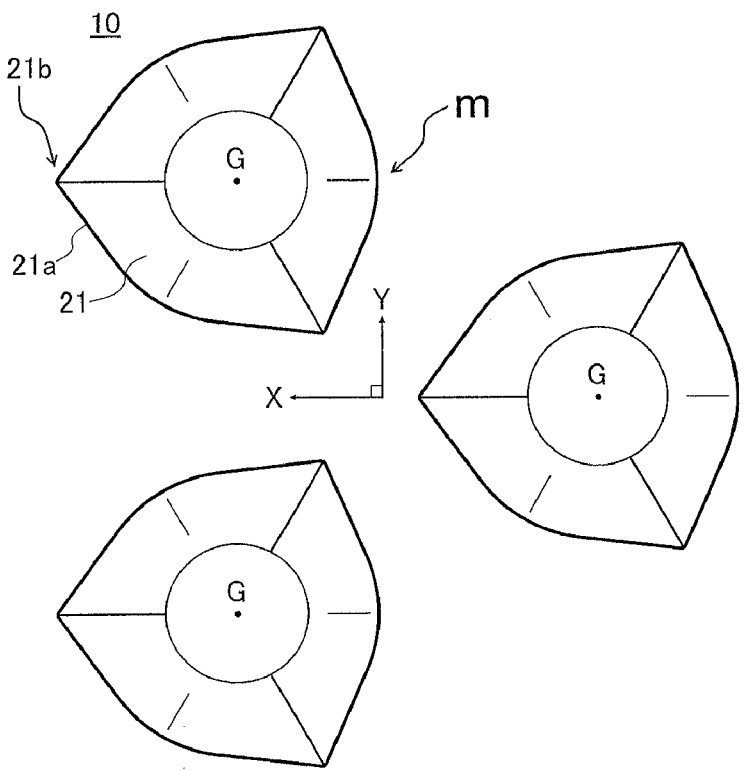
FIG. 1B is a plane view of another protruding portion formed in the one process of the method for manufacturing the semiconductor light emitting element of the present invention.
Figure 2B:
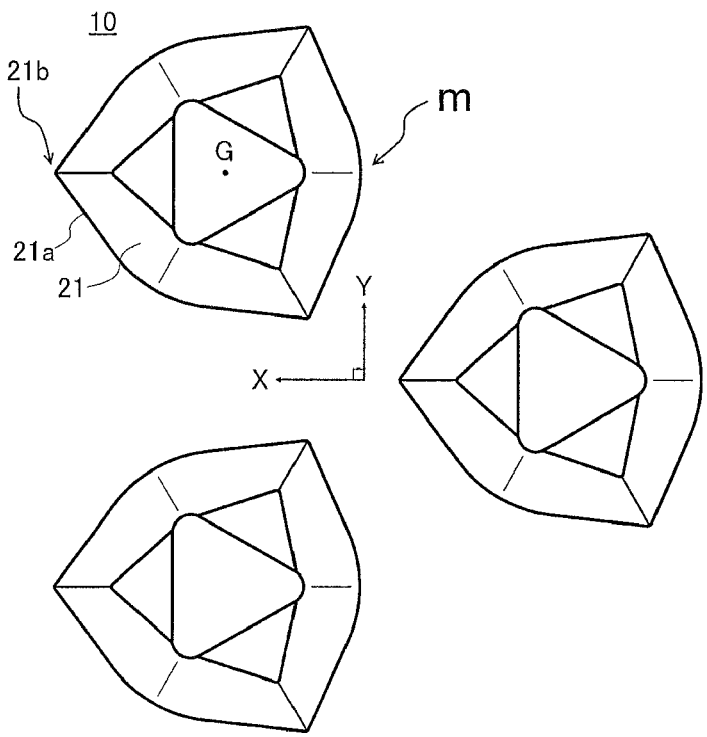
FIG. 2B is a plane view of still another protruding portion formed in the one process of the method for manufacturing the semiconductor light emitting element of the present invention.

Also, in a plan view from the first main face side of the sapphire substrate, when the shape of the protruding portion is substantially hexagonal as shown in FIGS. 1B and 2B, for example, the first break groove is formed so as to extend in a direction Y that is substantially perpendicular to the direction X that faces one acute angle vertex 21*b* from the center of gravity G of the hexagonal bottom face 21*a* of the protruding portion 21.

A semiconductor layer that is close to the sapphire substrate, and more specifically a semiconductor layer of a first conduction type, is preferably exposed as a first electrode formation region for obtaining electrical connection, either before, after, or during the formation of the first break groove, and before the second break line (discussed below) is formed.

Also, a second break line is formed in the interior of the sapphire substrate. The second break line can be formed by the same method as the first break groove, but forming it by irradiation with a laser beam is preferable.

It is particularly preferable to form it by irradiating with a laser beam with is transmitted by the sapphire substrate. The term "transmitted" here means that the transmissivity directly after the sapphire substrate is irradiated with the laser beam, that is, in a state in which the sapphire has not be modified, is at least 70%, and preferably at least 80%, and more preferably at least 90%.

The laser beam irradiation may be performed from the semiconductor layer side, but when absorption by the semiconductor layer is taken into account, it is preferably performed from the second main face side. The reason for this is to minimize the decrease in light emission efficiency by avoiding the irradiation of the semiconductor layer, and particularly the light emitting layer, with the laser beam.

The laser beam can be produced by a variety of lasers, such as a laser that generates a pulsed beam, or a continuous wave laser that can bring about multi-photon absorption. Among these, a device that generates a pulsed laser, such as a femto-second laser, a pico-second laser, or a nano-second laser, is preferable. There are no particular restrictions on the wavelength of this laser, and various lasers can be used, such as an Nd:YAG laser, an Nd:YVO$_4$ laser, an Nd:YLF laser, and a titanium sapphire laser.

Before the second break line is formed, the thickness of the sapphire substrate is set to between about 50 and 400 μm, and preferably about 80 and 160 μm. This allows multi-stage irradiation with the laser beam (discussed below) to be minimized, and makes it possible to split easily in the intended direction.

The second break line is preferably irradiated with a laser beam in multiple stages in the thickness direction of the sapphire substrate, according to the thickness of the sapphire substrate, the type of laser beam being used, the laser power, and the like. Examples of the multiple stages here include about two to eight stages, and preferably about two to four stages. From a different standpoint, it is preferable for there to be enough stages to reach a specific depth, as will be discussed below. For example, although it will vary with the type of laser beam being used, the laser power, and so forth, one-stage working is performed if the thickness of the sapphire substrate is about 50 to 90 μm, one- or two-stage working for about 90 to 100 μm, two- or three-stage working for about 100 to 120 μm, and three- or four-stage working for about 120 to 160 μm. This makes it easier to control the inclination of the split face even if the sapphire substrate is somewhat thick. In multi-stage working, there may or may not be a shift in the in-plane direction.

There are no particular restrictions on the width of the second break line, but when a laser beam is used as the means for forming this second break line, for example, the width can be suitably adjusted by varying the laser beam aperture or the like, and is at least about 1 μm, for example.

A suitable depth here is at least about one-fourth the thickness of the sapphire substrate. Preferably, it is at least about 30% and no more than about 70%, and more preferably no more than about 60%, and even more preferably no more than about 50%, of the thickness of the sapphire substrate. More specifically, an example is about 10 to 60 μm. This makes it easy to control the inclination of the split face, regardless of the thickness of the sapphire substrate. Also, there is no unnecessary modification of the sapphire, absorption of light by a modified portion can be kept to a minimum, and there is less decrease in the efficiency of light emission.

When an off angle is utilized on the first main face of the sapphire substrate, the second break line is preferably formed parallel to the first break groove, and it is even better if it is formed shifted, by the off angle, by a specific distance from the predicted split line (such as the center line) of the first break groove.

Figure 5:
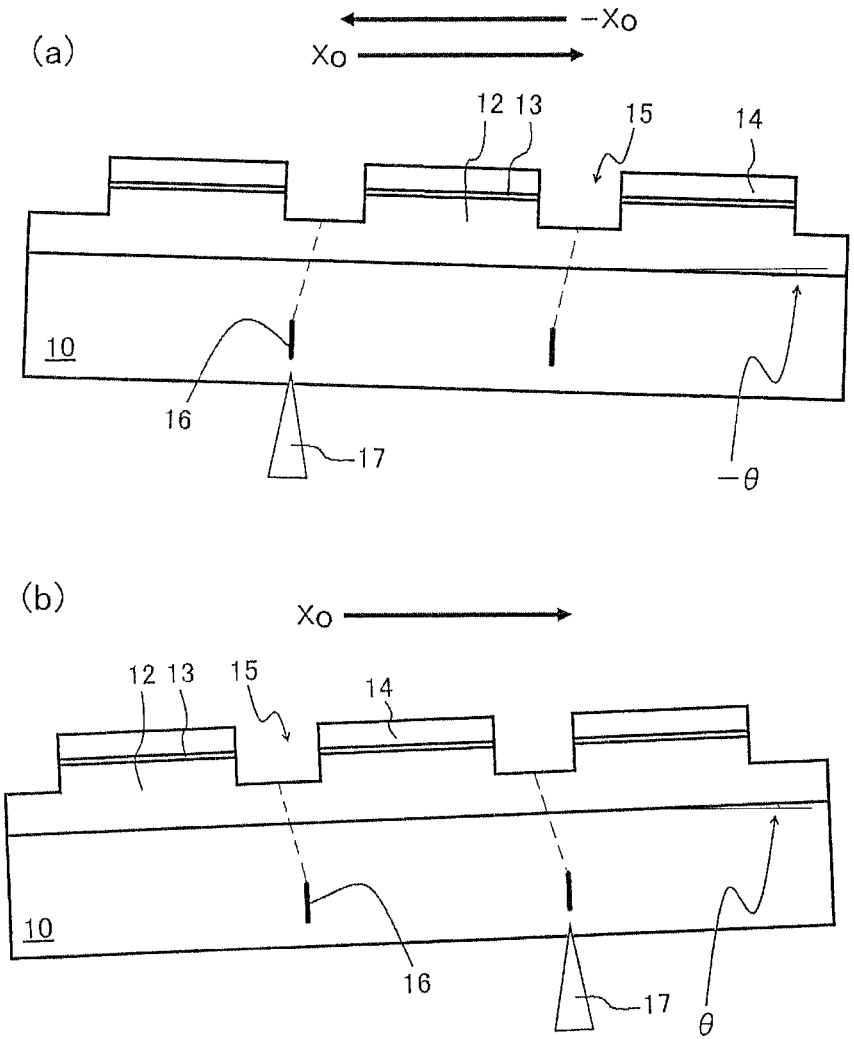
FIG. 5 is a schematic cross-sectional view showing still another positional relation of the first break groove and the second break line formed in the one process of the method for manufacturing the semiconductor light emitting element of the present invention.

More specifically, as shown in FIG. 5(*a*), if the off angle is −θ, that is, if the substrate descends from the left side to the right side when the orientation flat of the sapphire substrate is disposed in front, the second break line is preferably shifted by a specific distance in the rising direction (−Xo). When the off angle is +θ as shown in FIG. 5(*b*), that is, if the substrate rises from the left side to the right side when the orientation flat of the sapphire substrate is disposed in front, the second break line is preferably shifted by a specific distance in the rising direction (Xo).

Alternatively, the second break line is preferably formed parallel to the first break groove, and even more preferably is formed shifted by a specific distance in the −X direction from the predicted split line of the first break groove. The specific distance here can be suitably adjusted depending on the thickness of the sapphire substrate, the laser beam irradiation depth, and the like. For example, if the thickness of the sapphire substrate is within the above-mentioned range in the formation of the second break line, it is preferably formed at a location shifted by about 2 to 12 μm, and more preferably about 6 to 8 μm, from the first break groove in a plan view of the first main face of the sapphire substrate. This makes it possible to easily control the extent of inclination of the split face, and allows the split to be made at a specific location on the semiconductor layer side.

Figure 3:
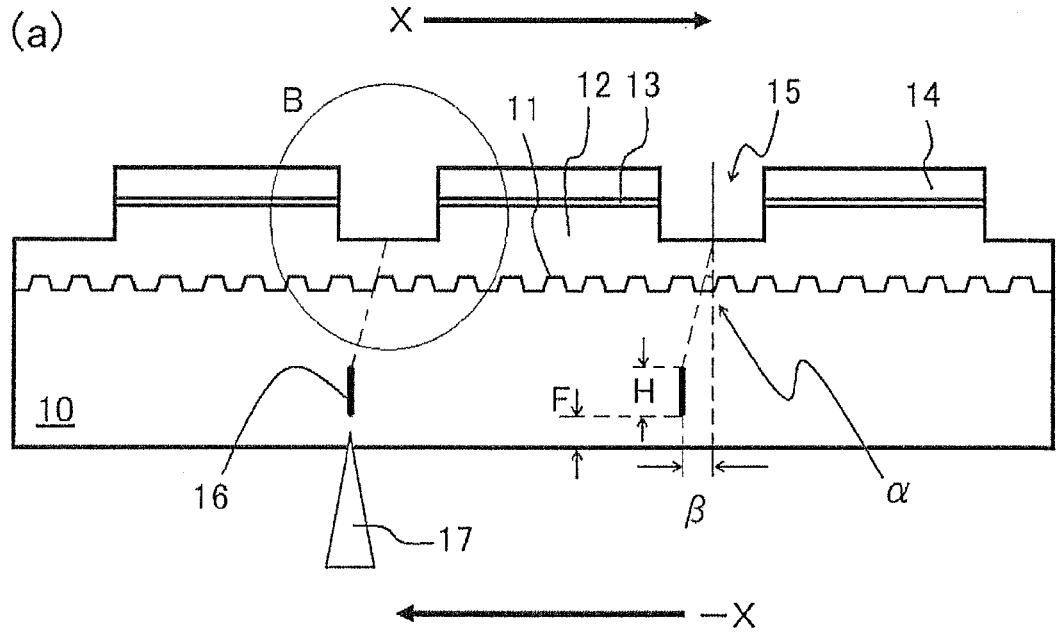
FIG. 3 is a schematic cross-sectional view showing positional relation of the first break groove and the second break line formed in the one process of the method for manufacturing the semiconductor light emitting element of the present invention.
Figure 3:
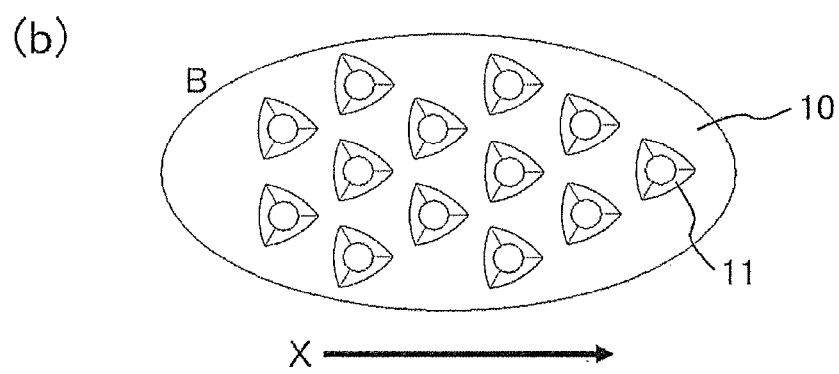
Figure 3:
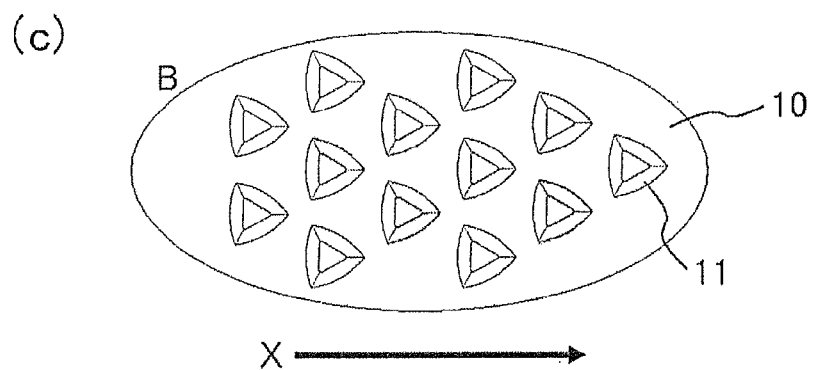
Figure 4:
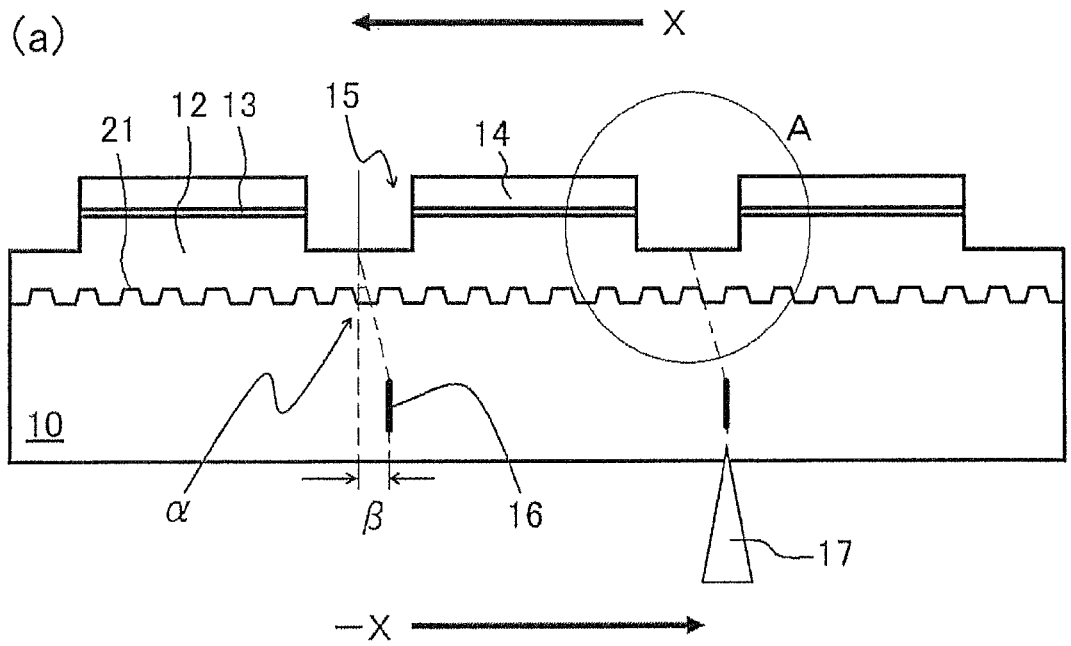
FIG. 4 is a schematic cross-sectional view showing another positional relation of the first break groove and the second break line formed in the one process of the method for manufacturing the semiconductor light emitting element of the present invention.
Figure 4:
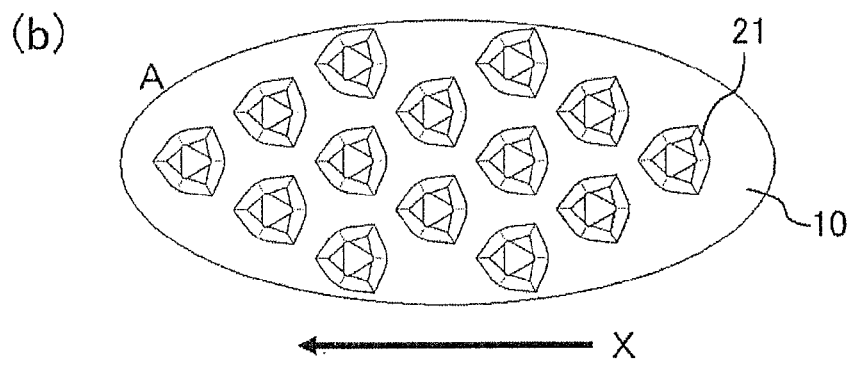

The direction of the shift is the −X direction, which is the opposite direction with respect to the direction X that faces a single acute angle vertex from the polygonal center of gravity of the bottom face of the protruding portion formed on the sapphire substrate. As a result, the extent of inclination of the split face can be easily controlled, so that splitting in a direction that is inclined to the region in the semiconductor layer that functions as the element can be avoided. When the protruding portions shown in FIG. 1A or 2A are formed, for example, this direction is the −X direction in reference to the location of a single acute angle vertex of a protruding portion as shown in FIGS. 3(a) and 3(b) or FIGS. 3(a) and 3(c), and when the protruding portions shown in FIG. 1B or 2B are formed, this direction is the −X direction in reference to the location of a single acute angle vertex of a protruding portion as shown in FIGS. 4(a) and 4(b).

It was discovered that the ± of the off angle θ tends to correspond to the direction of one acute angle of the polygonal bottom face of the protruding portions of the sapphire substrate surface, which faces a direction parallel to the orientation flat. That is, if the off angle is −θ, as shown in FIG. 5(a), one acute angle on the protruding portion bottom face tends to face in the direction of the arrow Xo (see FIGS. 3(a) to 3(c)). If the off angle is +θ, as shown in FIG. 5(b), one acute angle on the protruding portion bottom face tends to face in the direction of the arrow −Xo (the X direction in FIGS. 4(a) and 4(b)). For the sake of convenience, FIGS. 5(a) and 5(b) do not clearly depict the protruding portions on the sapphire substrate surface, and instead illustrate an aspect that clearly shows the angle of the surface.

Either the first break groove or the second break line may be formed first.

After this, the wafer is split along the first break groove and/or second break line. The split can be performed by a method that is known in this field. This allows the split face from the first break groove to the second break line to be inclined as intended from the normal line direction with respect to the first main face of the sapphire substrate. This inclination angle α is about 8°±5°, for example (α in FIGS. 3(a), 4 and 6).

There are no particular restrictions on the shape of the light emitting element obtained by the method of the present invention for manufacturing a semiconductor light emitting element, which may be triangular, diamond shaped, trapezoidal, or another such polygonal or substantially polygonal shape, but it is usually square or substantially square.

In an embodiment of the semiconductor light emitting element, if the semiconductor light emitting element is square, one pair of side faces of the element, that is, the side faces that are opposite each other in a direction substantially parallel to the orientation flat, are inclined, and the other pair of side faces, that is, the side faces that are opposite each other in a direction substantially perpendicular to the orientation flat, are substantially perpendicular, like the film thickness direction. Side face shapes such as these allow the scattering and/or refraction of light to be maximized, and allows the light take-off rate to be increased.

In another embodiment of the semiconductor light emitting element, one pair of side faces of the semiconductor light emitting element that are opposite each other are substantially perpendicular to the first main face of the sapphire substrate. The other pair of side faces have a face that is inclined with respect to the first main face on the first main face side of the sapphire substrate, and a face that is substantially perpendicular to the second main face on the second main face side of the sapphire substrate. The inclined faces and the substantially perpendicular faces are preferably each parallel to one another.

When the side faces of the sapphire substrate thus have faces in which one opposing pair of side faces are uniformly perpendicular, and have faces in which the other pair of opposing side faces are inclined to the first main face side and faces that are perpendicular on the second main face side (have a both perpendicular and inclined faces), the efficiency at which light is taken off to the outside can be improved, and in an embodiment in which the second main face is a mounting face, such as when the sapphire substrate side is mounted, the center of gravity stability of the semiconductor light emitting element can be ensured in the light emitting device or during or after mounting.

In yet another embodiment of the semiconductor light emitting element, the first main face of the sapphire substrate has protruding portions whose bottom face has a polygonal shape. At the same time, in a plan view from the first main face side of the sapphire substrate, the pair of opposing side faces of the semiconductor light emitting element that extend in a direction Y that is substantially perpendicular to a direction X that faces a single acute vertex from the center of gravity of the polyhedral shape of the protruding portion bottom face have a face that is inclined to the first main face on the first main face side of the sapphire substrate, and a face that is substantially perpendicular to the second main face on the second main face side of the sapphire substrate. Furthermore, the other pair of side faces is substantially perpendicular to the first main face of the sapphire substrate. When both perpendicular faces and inclined faces are thus present on the side faces of the sapphire substrate, just as discussed above, the light take-off efficiency can be improved, and the center of gravity stability of the semiconductor light emitting element can be ensured.

This sapphire substrate preferably has an off angle θ in the X direction. Also, the protruding portions preferably have side faces that are inclined with respect to the first main face of the sapphire substrate, and particularly side faces that are inclined in two stages. Furthermore, it is preferable if the protruding portions have the above-mentioned acute angle vertex in the X direction on the bottom face, and have a curving protruding part in the −X direction (the opposite direction from X), which is labeled m in FIGS. 1A and 1B and FIGS. 2A and 2B. When the curving protruding parts are thus opposite the inclined side faces of the sapphire substrate, light that advances to the substrate side will be refracted by the side (face) constituting the protruding part, and can be taken off to the outside sooner. That is, when the protruding parts and the inclined side face are opposite each other, the light can be incident perpendicular to the side face. Also, if the substrate side face in a direction (Y direction) perpendicular to the X direction is a perpendicular face, the side face in the Y direction will not be opposite the protruding part. Therefore, light will not be incident perpendicular to the side face of the Y direction, and can be take off to the outside sooner.

The semiconductor light emitting element of the present invention is preferably such that the inclined faces at the side faces of the semiconductor light emitting element are inclined by 8°±5° from the normal line direction with respect to the first main face of the sapphire substrate. It is also preferable if the inclined faces on the first main face side of the sapphire substrate are smoother than the perpendicular faces on the second main face side. This allows light reflected in the sapphire substrate to be efficiently reflected by the inclined faces, intentionally scattered by the perpendicular faces, and taken off to the outside more efficiently.

The method of the present invention for manufacturing a semiconductor light emitting element will now be described in detail through reference to the drawings.

EXAMPLES 1 to 12

First, sapphire substrates (about 400 μm thick) were provided that had the off angles shown in Table 1 in the Xo direction parallel to the A plane direction, with the orientation flat at the A plane (11-20) and using the C plan (0001) as the first main face.

TABLE 1

| Examples | Off Angle θ |
| --- | --- |
| 1 | 0.19 |
| 2 | −0.2 |
| 3 | 0.18 |
| 4 | 0.17 |
| 5 | −0.16 |
| 6 | −0.21 |
| 7 | 0.15 |
| 8 | −0.17 |
| 9 | 0.19 |
| 10 | 0.17 |
| 11 | 0.18 |
| 12 | −0.18 |

Semiconductor layers were formed over each of these sapphire substrates 10.

First, a low-temperature growth buffer layer of $Al_xGa_{1-x}N$ ($0 \leq x \leq 1$) was formed in a thickness of 10 nm, undoped GaN in a thickness of 3 μm, silicon-doped GaN in a thickness of 4 μm, and undoped GaN in a thickness of 300 nm, as an n-type semiconductor layer 12.

Over this, thick films of well layers and barrier layers (undoped InGaN and silicon-doped GaN; 6 nm and 25 nm), with six well layers and seven barrier layers, were alternately laminated as a multiple quantum well active layer 13 serving as a light emitting region.

In this case, the last barrier layer to be laminated may be undoped GaN. Also, if the first layer formed over the low-temperature growth buffer layer was undoped GaN, the protruding portions will be buried more evenly, and the crystallinity of the semiconductor layer formed over this will be better.

Over the active layer, magnesium-doped AlGaN in a thickness of 20 nm, undoped GaN in a thickness of 100 nm, and magnesium-doped GaN in a thickness of 20 nm were laminated as a p-type semiconductor layer. The undoped GaN layer formed as the p-type semiconductor layer becomes a p-type through the diffusion of magnesium from the adjacent layer.

Etching was performed using the desired mask from the surface of the resulting semiconductor layer. As a result, as shown in FIGS. 5(a) and 5b, a first break groove 15 was formed by etching down to, for example, the silicon-doped GaN as a part of the n-type semiconductor layer 12. The width of this first break groove 15 was 20 μm, for example. This first break groove 15 was formed, for example, in two directions substantially parallel to and substantially perpendicular to the orientation flat, respectively.

Simultaneously with the etching of this first break groove 15, part of the silicon-doped GaN layer was exposed (not shown) to form an n electrode.

After this, a translucent p electrode composed of ITO was formed over the entire surface of the p-type semiconductor layer, and a p pad electrode was formed over the translucent p electrode at a location opposite the exposed face of the n-type semiconductor layer. An n electrode composed of W/Al/W and an n pad electrode were formed on the exposed face of the n-type semiconductor layer. The p pad electrode and the n pad electrode were both composed of Ti/Rh/W/Au.

Next, the sapphire substrate 10 was polished from its rear face side to a thickness of about 50 to 160 μm, for example, and more specifically, to about 120 μm. An adhesive sheet was affixed to the semiconductor layer side of the resulting sapphire substrate 10. Here, the cleavage direction may be checked by metal microscope observation.

Then, the second break line 16 was formed from the rear face side of the sapphire substrate 10, in the interior of the sapphire substrate 10, parallel to the first break groove 15, and at a position that was shifted by a distance β from the predicted split line of the first break groove 15 extending in a direction substantially perpendicular to the orientation flat, in the −Xo direction as shown in FIG. 5(a) when the off angle was −θ, and in the Xo direction as shown in FIG. 5(b) when the off angle was +θ. The distance β here was about 2 to 12 μm, for example, and more specifically about 7 μm.

Also, the second break line 16 was formed at a distance of about 65 μm to the semiconductor layer in a first stage, and to a depth of about 35 μm in a direction away from the semiconductor layer in a total of three stages by femto-second laser, from the rear face of the sapphire substrate 10. The distance from the sapphire substrate rear face to the second break line (the distance to the third stage) was about 20 μm.

Thus, with the present invention, the inclination of the break face of the sapphire substrate 10 can be determined from plus and minus of the off angle of the surface of the sapphire substrate, so there is no need to do any trial splitting to see how the break face will be inclined, splitting in the direction of inclination of the sapphire substrate can be controlled with the inclination of the off angle θ, and the yield can be markedly increased.

Furthermore, the second break line 16 formed in a direction substantially parallel to the orientation flat was formed at a location that substantially overlaps the predicted split line of the first break groove 15.

Figure 6:
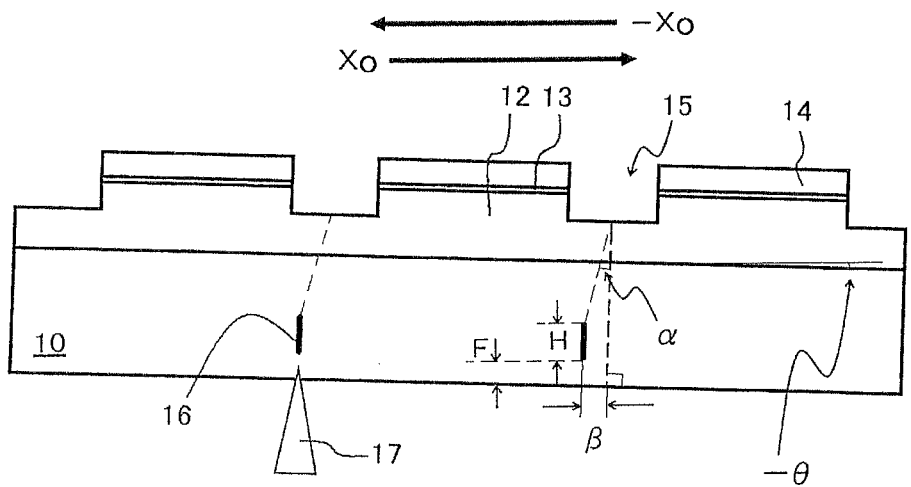
FIG. 6 is a schematic cross-sectional view showing still another positional relation of the first break groove and the second break line formed in the one process of the method for manufacturing the semiconductor light emitting element of the present invention.

The wafer was then split into chips along the first break groove 15 and the second break line 16, which gives semiconductor chips measuring about 350 μm on one side. As shown in FIG. 6, the wafer here was split at an angle along the break line, inclined by α° in the −Xo direction from the normal line direction with respect to the surface of the sapphire substrate. The angle α of the split face was about 19°.

Here, the semiconductor chips obtained by splitting the sapphire substrate at an angle in the intended direction were confirmed to have a yield of approximately 92%, which was extremely high.

These chips were mounted on a lead frame equipped with a reflecting mirror to produce LED bullets.

Thus, with the resulting semiconductor light emitting element, the regularity of the sapphire substrate can be determined from the off angle of the substrate surface, and the second break line can be shifted in a suitable direction with respect to the first break groove, so the splitting of the wafer can be easily controlled and the yield can be markedly increased. Also, there is no need to provide a margin that foresees unintended splitting and so forth, which maximizes the number of chips that can be obtained form a single wafer, and boosts the production efficiency. As a result, there is no need to confirm the split face ahead of time by test splitting, eliminating the need for considerable multi-stage laser irradiation in the entire thickness direction and the in-plane direction of the sapphire substrate, which makes it possible to reduce manufacturing costs.

Also, in splitting, regardless of the thickness of the sapphire substrate, the split face can be controlled even with rather thick substrates, chip strength can be ensured, and handling is easier in prior and subsequent steps.

It has been confirmed that if the off angle is 0° in the Xo direction, the specified regularity will be present, although as discussed above this may be affected by the correlation to whether or not there is an off angle θ other than in a direction substantially parallel to the orientation flat, the extent of this off angle θ, the surface roughness of the sapphire substrate, and various other factors.

EXAMPLE 13

First, sapphire substrate with the orientation flat at the A plane (11-20) and using the C plan (0001) as the first main face was provided.

An $SiO_2$ film was formed in a thickness of about 0.5 µm over a sapphire substrate 10 with a thickness of about 400 µm, and a repeating pattern consisting of uniformly disposed circular patterns was formed.

Next, this repeating pattern was used to subject the sapphire substrate to wet etching of 0.5 to 4 µm, which formed protruding portions 11 on the surface of the sapphire substrate 10 as shown in FIG. 1A. These protruding portions 11 were substantially in the form of a frustum of a triangular pyramid in which the shape of the bottom face 11a was substantially triangular, while the shape of the upper face was substantially circular. The length of the triangular shape of the bottom face 11a was about 5 µm, while the distance between the centers of gravity G of adjacent protruding portions 11 was 7 µm. The inclination angle of the side faces of the protruding portions 11 was 120°. One vertex 11b of the triangular shape of the bottom face 11a of each protruding portion 11 faced in the X direction (the specific direction). This X direction was parallel to the orientation flat.

The etching here was wet etching with a mixture of sulfuric acid and phosphoric acid, and was carried out with the other conditions adjusted.

Next, semiconductor layers were formed as shown in FIG. 3(a) over the sapphire substrate 10 having the repeating pattern of protruding portions 11.

The semiconductor layers were formed by the same method as in Example 1.

The second break line 16 was formed in the interior of the sapphire substrate 10, at a position that was shifted parallel to the first break groove 15 by a distance β from the predicted split line of the first break groove 15 extending in a direction substantially perpendicular to the orientation flat, in the –X direction, which was the opposite direction from the above mentioned X direction, from the rear face side of the sapphire substrate 10. The distance β here was about 2 to 12 µm, for example, and more specifically about 7 µm. Also, the second break line 16 was formed at a distance of about 65 µm to the semiconductor layer in a first stage, and to a depth of about 35 µm in a direction away from the semiconductor layer in a total of three stages by femto-second laser, from the rear face of the sapphire substrate 10. The distance from the sapphire substrate rear face to the second break line (the distance to the third stage) was about 20 µm.

With the present invention, in forming the protruding portions on the surface of the sapphire substrate 10, the inclination of the break face of the sapphire substrate can be determined by the disposition and orientation of the protruding portions (the orientation of the vertexes), and by the relation of these to the orientation flat, so there is no need to do any trial splitting to see how the break face will be inclined.

Furthermore, the second break line 16 formed in a direction substantially parallel to the orientation flat was formed at a location that substantially overlaps the predicted split line of the first break groove 15.

Next, the wafer was split into chips along the first break groove 15 and the second break line 16, which gave semiconductor chips measuring about 350 µm on one side. As shown in FIG. 3(a), the wafer here was split at an angle along the break line, inclined by α° in the –X direction, that was the opposite direction from the direction in which the vertex 11b was facing on the bottom face 11a of the protruding portion 11 of the sapphire substrate 10, from the normal line direction with respect to the surface of the sapphire substrate. The angle α of the split face was about 19°.

These chips were mounted on a lead frame equipped with a reflecting mirror to produce LED bullets.

Thus, with the resulting semiconductor light emitting element, the regularity of the sapphire substrate can be determined from the off angle of the substrate surface, and the second break line can be shifted in a suitable direction with respect to the first break groove, so the splitting of the wafer can be easily controlled and the yield relating to the wafer split can be markedly increased as about 100%. Also, there is no need to provide a margin that foresees unintended splitting and so forth, which maximizes the number of chips that can be obtained form a single wafer, and boosts the production efficiency. As a result, there is no need to confirm the split face ahead of time by test splitting, eliminating the need for considerable multi-stage laser irradiation in the entire thickness direction and the in-plane direction of the sapphire substrate, which makes it possible to reduce manufacturing costs.

Also, in splitting, regardless of the thickness of the sapphire substrate, the split face can be controlled even with rather thick substrates, chip strength can be ensured, and handling is easier in prior and subsequent steps.

EXAMPLE 14

A sapphire substrate was provided that was different from that in Example 1, although the orientation flat was in the A plane (11-20) and the C plan (0001) was used as the first main face, a mask pattern was formed in the same manner, and wet etching was performed with a mixture of sulfuric acid and phosphoric acid, and with the etching conditions varied, to etch the surface of the sapphire substrate 10. As shown in FIG. 2, this formed protruding portions 21 on the surface of the sapphire substrate 10. These protruding portions 21 were substantially in the form of a frustum of a hexagonal pyramid in which the shape of the bottom face 21a was modified. The length of one side linking vertexes of the hexagonal shape of the bottom face 21a was about 5 µm, while the distance between the centers of gravity G of adjacent protruding portions 21 was 7 µm. The inclination angle of the side faces of the protruding portions 21 was 120°. One vertex 21b of the hexagonal shape of the bottom face 21a of each protruding portion 21 faced in the X direction (the specific direction). This X direction was parallel to the orientation flat.

It was confirmed that setting a longer etching time shaved off the obtuse angles and resulted in a triangular shape.

Next, semiconductor layers were formed in the same manner as in Example 1.

As shown in FIG. 4(a), the first break groove 15 was formed in the same manner as in Example 13 by etching part of the n-type semiconductor layer 12, such as down to the silicon-doped GaN.

After this, just as in Example 13, electrodes were formed on the p-type semiconductor layer and the n-type semiconductor layer.

Then, just as in Example 13, the sapphire substrate was polished and an adhesive sheet was affixed.

As shown in FIGS. 4(a) and 4(b), the second break line 16 was formed in the same manner as in Example 13, inside the sapphire substrate 10 and at a position that was shifted parallel to the first break groove 15 by a distance β from the predicted split line of the first break groove 15 extending in a direction substantially perpendicular to the orientation flat, in the −X direction, which was the opposite direction from the above-mentioned X direction, from the rear face side of the sapphire substrate 10.

Then, the wafer was split into chips in the same manner as in Example 13, which gave semiconductor chips measuring about 350 μm on one side. As shown in FIG. 4(a), the wafer here was split at an angle along the break line, inclined by α° in the −X direction, that is, the opposite direction from the direction in which the vertex 21b was facing on the bottom face 21a of the protruding portion 21 of the sapphire substrate 10, from the normal line direction with respect to the surface of the sapphire substrate. The inclination angle α of this split face was about 7°.

These chips were mounted on a lead frame equipped with a reflecting mirror to produce LED bullets.

Thus, with the resulting semiconductor light emitting element, the same effects were obtained as the semiconductor light emitting element of Example 13, and light emission efficiency was the same as Example 13.

The present invention is widely-utilized not only as the light emitting diode, laser element and the like, but also in the method for manufacturing any semiconductor light emitting elements

The invention claimed is:

1. A method for manufacturing a semiconductor light emitting element from a wafer in which a gallium nitride compound semiconductor has been laminated on a sapphire substrate having an orientation flat, said method comprising:
    laminating a semiconductor layer on a first main face of the sapphire substrate having an off angle θ in a direction Xo parallel to the orientation flat;
    forming a first break groove that extends in a direction Y substantially perpendicular to the direction Xo, on the semiconductor layer side;
    forming a second break line that is shifted by a predetermined distance in the ±Xo direction from a predicted split line within the first break groove and parallel to the first break groove in the interior of the sapphire substrate and corresponding to the inclination of the off angle θ, the second break line being spaced apart from a second main face of the sapphire substrate opposite from the first main face; and
    splitting the wafer along the first break groove and/or second break line.

2. The method according to claim 1, wherein Xo is a direction facing to the right side and −Xo is a direction facing to the left side in a plan view from the first main face side of the sapphire substrate disposed with the orientation flat in front, and
    the second break line is formed shifted by the predetermined distance in the −Xo direction from the predicted split line within the first break groove when the sapphire substrate has an off angle of −θ in the Xo direction, and shifted by the predetermined distance in the +Xo direction from the predicted split line within the first break groove when the sapphire substrate has an off angle of +θ in the Xo direction.

3. A method for manufacturing a semiconductor light emitting element from a wafer in which a gallium nitride compound semiconductor has been laminated on a sapphire substrate, said method comprising:
    forming a protruding portion whose bottom face shape is polyhedral by etching on a first main face of the sapphire substrate;
    laminating a semiconductor layer on the first main face of the sapphire substrate;
    forming on the semiconductor layer side a first break groove that extends in a direction Y that is substantially perpendicular to a direction X that faces a single acute vertex from the center of gravity of the polyhedral shape of the protruding portion bottom faces in a plan view of the first main face side of the sapphire substrate;
    forming a second break line that is shifted by a predetermined distance in a −X direction from a predicted split line within the first break groove and parallel to the first break groove in the interior of the sapphire substrate, the second break line being spaced apart from a second main face of the sapphire substrate opposite from the first main face; and
    splitting the wafer along the first break groove and/or second break line.

4. The method according to claim 3, wherein the sapphire substrate has an orientation flat, and the first main face and/or a second main face have off angle θ of an Xo direction that is parallel to the orientation flat.

5. The method according to claim 3, wherein the direction X that faces a single acute vertex from the center of gravity of the polyhedral shape of the protruding portion bottom faces is substantially parallel to the orientation flat of the sapphire substrate.

6. The method according to claim 3, wherein etching is wet-etching.

7. The method according to claim 1, wherein the second break line is formed by irradiation with a laser light.

8. The method according to claim 1, wherein the laser light is a light transmitted by the sapphire substrate.

9. The method according to claim 1, wherein the semiconductor layers are formed of a first conductivity type layer, a light emitting layer and a second conductivity type layer in this order from the sapphire substrate side, and the first break groove is formed so as to expose the first conductivity type layer.

10. The method according to claim 1, wherein the second break line is formed so as to expose the sapphire substrate.

11. The method according to claim 1, wherein thickness of the sapphire substrate is set to between about 50 and 400 μm before the second break line is formed.

12. The method according to claim 1, wherein the second break line is formed with depth of about one-fourth or more of the thickness of the sapphire substrate.

13. The method according to claim 1, wherein the second break line is formed by multi-stage laser light irradiation over the thickness direction of the sapphire substrate.

14. The method according to claim 1, wherein the second break line is formed shifted from the first break groove so that the split face from the first break groove to the second break line is inclined by 8°±5° from the normal line direction with respect to the first main face of the sapphire substrate.

15. The method according to claim 1, wherein the second break line is formed shifted by 2 to 12 μm from the predicted split line of the first break groove in plan view from the first main face side of the sapphire substrate.

16. The method according to claim 1, wherein the second break line is formed from the second main face side of the sapphire substrate.

17. The method according to claim 1, wherein the first main face of the sapphire substrate is one of C plane, A plane, R plane, and M plane.

18. The method according to claim 1, wherein the off angle θ is about 0 to ±0.25°.

19. The method according to claim 1, wherein the semiconductor layer includes $In_xAl_yGa_{1-x-y}N$ ($0 \leq x \leq 1$, $0 \leq y \leq 1$, $0 \leq x+y \leq 1$).

20. The method according to claim 7, wherein the second break line is irradiated with the laser light in multiple stages in a thickness direction of the sapphire substrate.

21. The method according to claim 1, wherein the orientation flat of the sapphire substrate is A plane.

22. The method according to claim 3, wherein the first main face of the sapphire substrate is one of C plane, A plane, R plane, and M plane.

23. The method according to claim 4, wherein the off angle θ is about 0 to ±0.25°.

24. The method according to claim 3, wherein a vertical cross sectional shape of the protruding portion is one of triangular, square, trapezoidal, and semicircular.

25. The method according to claim 3, wherein the semiconductor layer includes $In_xAl_yGa_{1-x-y}N$ ($0 \leq x \leq 1$, $0 \leq y \leq 1$, $0 \leq x+y \leq 1$).

26. The method according to claim 3, wherein the second break line is formed by irradiation with a laser light.

27. The method according to claim 26, wherein the second break line is irradiated with the laser light in multiple stages in a thickness direction of the sapphire substrate.

28. The method according to claim 3, wherein the orientation flat is A plane.

* * * * *